(12) United States Patent
Chou

(10) Patent No.: US 8,309,401 B2
(45) Date of Patent: Nov. 13, 2012

(54) METHOD OF MANUFACTURING NON-LEADED PACKAGE STRUCTURE

(75) Inventor: Shih-Wen Chou, Hsinchu (TW)

(73) Assignee: ChipMOS Technologies Inc., Hsinchu (TW)

(*) Notice: Subject to any disclaimer, the term of this patent is extended or adjusted under 35 U.S.C. 154(b) by 35 days.

(21) Appl. No.: 13/030,141

(22) Filed: Feb. 18, 2011

(65) Prior Publication Data
US 2012/0153449 A1 Jun. 21, 2012

(30) Foreign Application Priority Data
Dec. 15, 2010 (TW) .............................. 99144067 A

(51) Int. Cl.
*H01L 21/60* (2006.01)
(52) U.S. Cl. ................. 438/123; 257/E21.506
(58) Field of Classification Search .......... 438/111–112, 438/123–124; 257/666–674, 676, 677, E23.031–E23.061, 257/E21.506, E23, 66
See application file for complete search history.

(56) References Cited

U.S. PATENT DOCUMENTS

| 2009/0166824 A1* | 7/2009 | Do et al. ............ 257/676 |
| 2009/0230524 A1* | 9/2009 | Chien et al. ......... 257/676 |
| 2010/0258921 A1* | 10/2010 | Chien et al. ......... 257/676 |

* cited by examiner

*Primary Examiner* — Victor A Mandala
*Assistant Examiner* — Selim Ahmed
(74) *Attorney, Agent, or Firm* — Jianq Chyun IP Office

(57) ABSTRACT

A manufacturing method of a non-leaded package structure is provided. An upper surface and a lower surface of a metal base plate are patterned so as to form a plurality of first protruding parts and at least a second protruding part on the upper surface and to form a plurality of first recess patterns on the lower surface corresponding to the first protruding parts. A first solder layer is formed in each of the first recess patterns respectively. A chip is mounted on the second protruding part and electrically connected to the first protruding parts with a plurality of bonding wires. An encapsulant is formed on the upper surface. A back etching process is performed on the lower surface to partially remove the metal base plate until the encapsulant is exposed and a lead group including at least a die pad and a plurality of leads is defined.

10 Claims, 7 Drawing Sheets

METHOD OF MANUFACTURING NON-LEADED PACKAGE STRUCTURE

CROSS-REFERENCE TO RELATED APPLICATION

This application claims the priority benefit of Taiwan application serial no. 99144067, filed on Dec. 15, 2010. The entirety of the above-mentioned patent application is hereby incorporated by reference herein and made a part of this specification.

BACKGROUND OF THE INVENTION

1. Field of the Invention

The invention generally relates to a non-leaded package structure, and more particularly, to a quad or dual flat non-leaded package structure (QFN or DFN package structure) with protruded leads and a manufacturing method thereof.

2. Description of Related Art

Among the various packaging types in the semiconductor packaging industry, the flat packages such as quad or dual flat non-leaded (QFN or DFN) packages have the advantages of shorter signal transmission paths and relatively faster signal transmission speeds. Therefore, the QFN or DFN packages are quite suitable for chip packages with high-frequency signal transmission, for example, the radio-frequency band signals, and have become one of the mainstreams for the low-pin-count packages.

In the packaging processes of QFN or DFN packages, a plurality of chips are disposed on a leadframe. Then, each of the chips is electrically connected to the leadframe through a plurality of bonding wires. An encapsulant is formed to cover a portion of the leadframe, the bonding wires and the chips. Finally, the above-mentioned structure is singulated into a plurality of individual QFN or DFN package structures by a punch process or a sawing process.

In order to meet the users' requirements for higher capabilities of the small size chip packages, increasing the density of leads is usually attempted to achieve the required goal. However, it is restrained in increasing the number of leads of the leadframe commonly used in the QFN or DFN packages; hence, solutions to produce higher density of leads in the packages with the packaging technologies to fulfill the demand are eagerly pursued. Besides increasing the density of leads, to sustain the bonding strength between the leads and the encapsulant (mold locking) and to enhance the surface mount application ability and convenience for the QFN or DFN packages are also main concerns in packaging so as to increase the applicability thereof.

SUMMARY OF THE INVENTION

Accordingly, the invention is directed to a non-leaded package structure, for example, a QFN or DFN package structure, which has leads protruding out of the bottom of the encapsulant and with the solder layer preformed on the lower surfaces thereof. The solder layer therein not only can serve as a shield layer for the leads, but also simplify the successive steps of soldering the non-leaded package structure on a PCB by surface mount technology (SMT) so as to effectively advance the convenience of the subsequent manufacturing processes.

The invention is also directed to a manufacturing method of a non-leaded package structure for manufacturing the above-mentioned non-leaded package structure in better reliabilities and effectively enhanced convenience of the manufacturing processes.

The invention provides a manufacturing method of a non-leaded package structure, which includes following steps. A metal base plate having an upper surface and a lower surface opposite to each other is provided. The upper surface and the lower surface of the metal base plate are patterned so as to form a plurality of first protruding parts and at least a second protruding part on the upper surface and to form a plurality of first recess patterns on the lower surface corresponding to the first protruding parts. A first solder layer is respectively formed in each of the first recess patterns. A chip is mounted on the second protruding part. A plurality of bonding wires are formed for electrically connecting the chip to the first protruding parts respectively. An encapsulant is formed on the upper surface of the metal base plate, wherein the encapsulant covers the chip, the first protruding parts, the second protruding part and the bonding wires. A back etching process is performed on the lower surface of the metal base plate with the first solder layer serving as an etch mask to partially remove the metal base plate until the encapsulant is exposed and a lead group is defined, wherein the lead group comprises at least a die pad carrying the chip and a plurality of leads isolated to one another. A lower surface and a portion of at least a side surface of each of the leads are exposed from the encapsulant and partially covered by the first solder layer.

In an embodiment of the present invention, each of the above-mentioned first recess patterns defines outlines of the lower surface and the portion of the side surface of each the lead exposed from the encapsulant.

In an embodiment of the present invention, the method of the above-mentioned step of forming the first recess patterns is selected from etching or laser ablation.

In an embodiment of the present invention, a metallic plating layer is formed on the first protruding parts after patterning the metal base plate.

In an embodiment of the present invention, a first neck portion is formed on the side surface of each the lead during the back etching process performed on the lower surface of the metal base plate.

In an embodiment of the present invention, a reflow process is performed to the first solder layer after the back etching process performed on the lower surface of the metal base plate, wherein a portion of the first solder layer extends and fills into the first neck portion of each the lead.

In an embodiment of the present invention, a second recess pattern is further formed on the lower surface of the metal base plate corresponding to the second protruding part during patterning the metal base plate, and the first solder layer is formed in the second recess pattern during forming the first solder layer in each of the first recess patterns.

In an embodiment of the present invention, a plurality of third recess patterns are formed on the upper surface of the metal base plate during patterning the metal base plate, wherein each of the third recess patterns surrounds each the first protruding part and is corresponding to each of the first recess patterns, and a second solder layer is formed in each of the third recess patterns during forming the first solder layer.

In an embodiment of the present invention, each the above-mentioned first recess pattern comprises a first depression and a second depression, the second depression surrounds the first depression, and the depth of the second depression relative to the lower surface of the metal base plate is greater than the depth of the first depression relative to the lower surface of the metal base plate.

In an embodiment of the present invention, the above-mentioned first recess pattern substantially has an equal depth relative to the lower surface of the metal base plate.

The present invention also provides a non-leaded package structure, which comprises a lead group, a chip, an encapsulant and a solder layer. The lead group comprises a die pad and a plurality of leads, wherein the leads are disposed surrounding the die pad. The chip is mounted on the die pad of the lead group and electrically connected to the leads through a plurality of bonding wires. The encapsulant covers the chip, the bonding wires and the lead group, wherein a bottom surface of the die pad, a lower surface and a portion of at least a side surface of each the lead are exposed from the encapsulant. The solder layer covers the lower surface and the portion of the side surface of each the lead exposed from the encapsulant.

In an embodiment of the present invention, the above-mentioned side surface of each the lead includes a first neck portion thereon and a portion of the solder layer extends and fills into the first neck portion.

In an embodiment of the present invention, the above-mentioned solder layer is further disposed on the bottom surface of the die pad.

In an embodiment of the present invention, a portion of a side surface of the die pad is exposed from the encapsulant and the solder layer covers the bottom surface and the portion of the side surface of the die pad.

In an embodiment of the present invention, the above-mentioned side surface of the die pad exposed from the encapsulant includes a second neck portion thereon and a portion of the solder layer extends and fills into the second neck portion.

In an embodiment of the present invention, the above-mentioned non-leaded package structure further comprises a metallic plating layer disposed on an upper surface of each the lead opposite to the lower surface.

Based on the above, in comparison with the prior art where a solder layer should further be applied on the exposed terminals of the non-leaded package structure after the package structure is completed for surface mount application to attach the non-leaded package structure on a PCB, in the present invention a solder layer is formed in advance in the recess patterns on the lower surface of the metal base plate, and a plurality of leads protruding out of the encapsulant with the solder layer coated on the lower surfaces thereof can then be formed after a back etching process. Hence, the preformed solder layers in the invention not only can serve as the shield layers for the leads but also simplify the subsequent manufacturing processes for surface mount application, which can effectively advance the product reliability and the convenience of the subsequent manufacturing processes.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
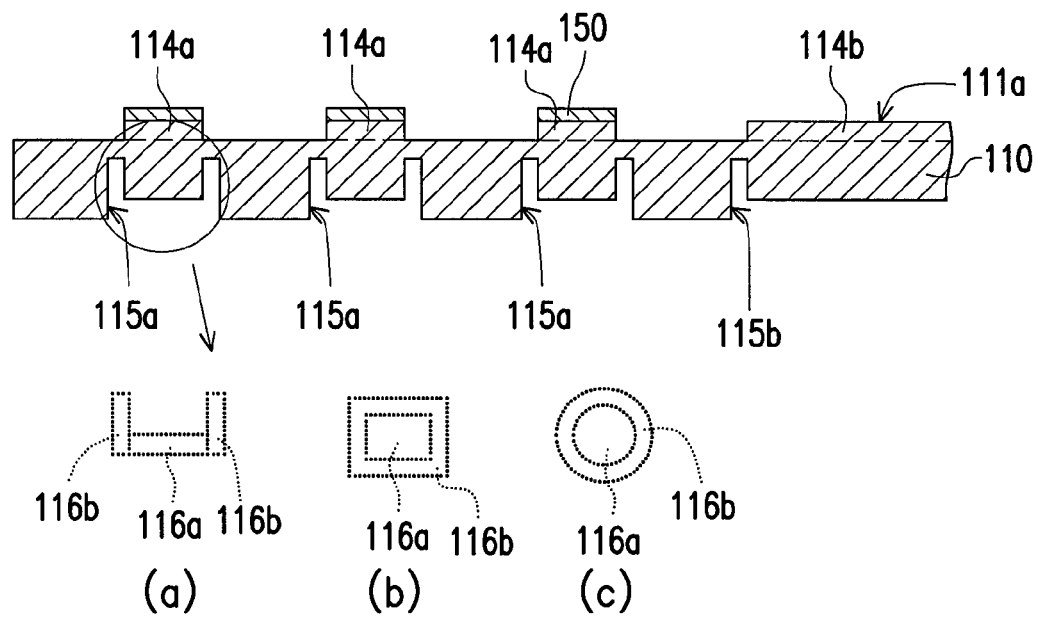
FIGS. 1A-1E are cross-sectional diagrams of a method for manufacturing a non-leaded package structure according to an embodiment of the invention.

FIGS. 1A-1E are cross-sectional diagrams of a method for manufacturing a non-leaded package structure according to an embodiment of the invention. Referring to FIG. 1A, the sub diagram (a) in FIG. 1A is a cross-sectional diagram of a first depression and a second depression, the sub diagram (b) is a top view diagram of the first depression and the second depression in an embodiment and the sub diagram (c) is a top view diagram of a first depression and a second depression of another embodiment. The method for manufacturing a non-leaded package structure of the embodiment includes following steps. Firstly, referring to FIG. 1A, a metal base plate 110 is provided. In more details, the metal base plate 110 of the embodiment includes an upper surface 111a and a lower surface 111b opposite to each other.

Next, referring to FIG. 1A again, the upper surface 111a and the lower surface 111b of the metal base plate 110 are patterned so as to form a plurality of first protruding parts 114a and at least a second protruding part 114b both on the upper surface 111a, and a plurality of first recess patterns 115a corresponding to the first protruding parts 114a and a second recess pattern 115b corresponding to the second protruding part 114b both on the lower surface 111b. In particular, referring to the sub diagram (a), in the present embodiment, each of the first recess patterns 115a includes a first depression 116a and a second depression 116b, wherein the first depression 116a is surrounded by the second depression 116b, and the depth of the second depression 116b relative to the lower surface 111b is greater than the depth of the first depression 116a relative to the lower surface 111b. That is to say, the first recess pattern 115a has depressions with two different depths. Similarly, as shown by FIG. 1A in the embodiment, the second recess pattern 115b also has depressions with two different depths, which the invention is not limited to. In addition, the shape of the first depression 116a and the second depression 116b can be rectangular, for example, referring to the sub diagram (b), or circular/oval, referring to the sub diagram (c), which the invention is not limited to. In the embodiment, the method of forming the first recess patterns 115a and the second recess pattern 115b can be etching or laser ablation, for example, and the metal base plate 110 can be a copper plate.

Figure 1B:
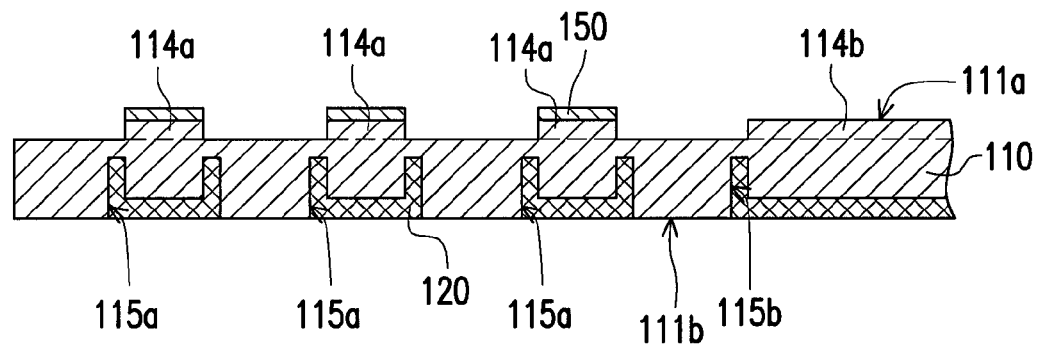

Then, referring to FIG. 1B, a first solder layer 120 is respectively formed in each of the first recess patterns 115a and the second recess pattern 115b. In the embodiment, the material of the first solder layer 120 can be selected from Pb—Sn solder or lead free solder.

Still referring to FIG. 1B, a metallic plating layer 150 is optionally formed on the first protruding parts 114a, respectively. In the embodiment, the material of the metallic plating layer 150 can be selected from gold, silver or palladium.

Figure 1C:
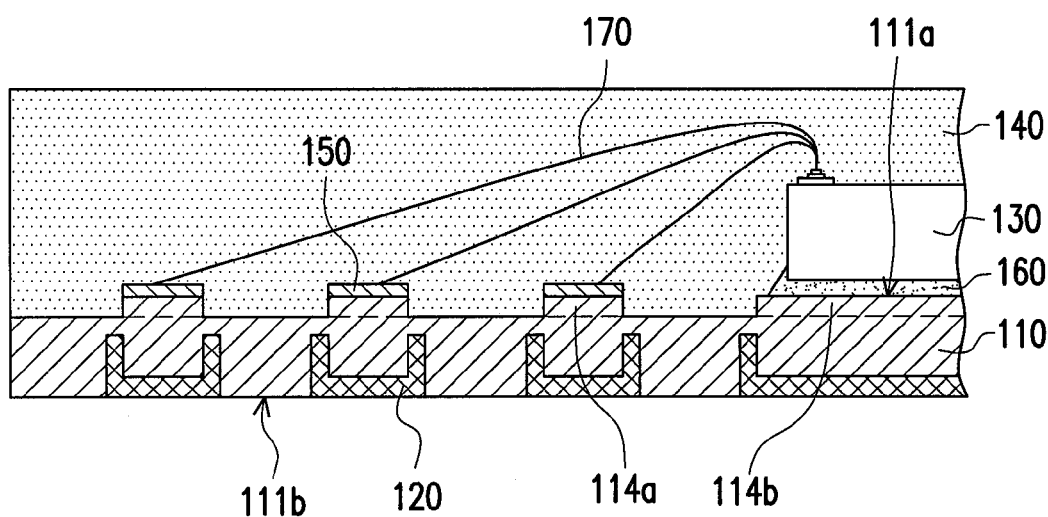

Then, referring to FIG. 1C, a chip 130 is mounted on the second protruding part 114b, wherein an adhesive layer 160 is formed between the chip 130 and the second protruding part 114b to fix the chip 130 on the second protruding part 114b. The adhesive layer 160 can be selected from epoxy resin or die attach film.

Next, a wire bonding process is performed to form a plurality of bonding wires 170 for electrically connecting a plurality of pads (not shown) on the chip 130 to the corresponding first protruding parts 114a respectively.

After that, an encapsulation process is performed to form an encapsulant 140 on the upper surface 111a of the metal base plate 110, wherein the encapsulant 140 covers the chip 130, the first protruding parts 114a, the second protruding part 114b and the bonding wires 170.

Figure 1D:
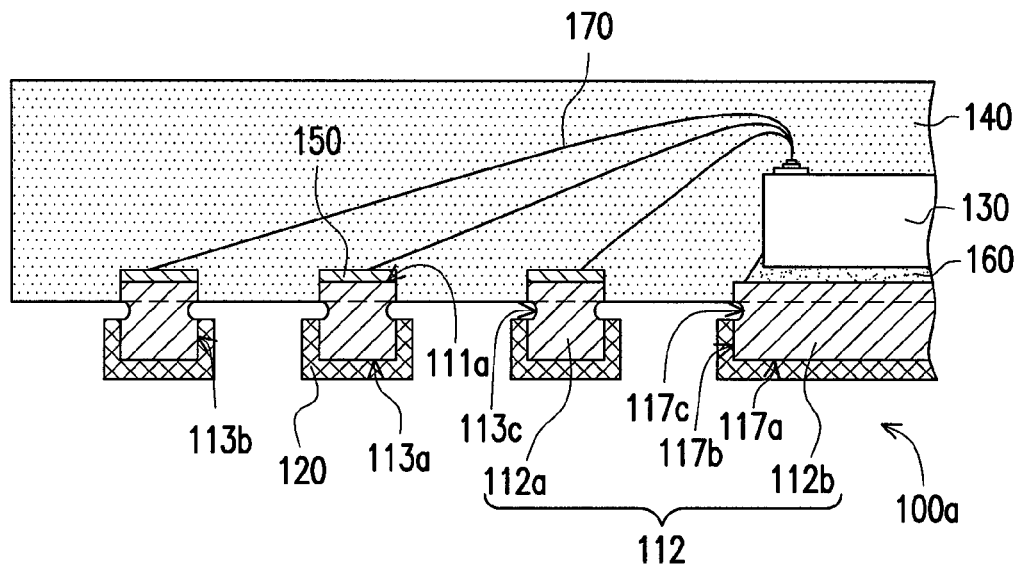

Finally referring to FIGS. 1C and 1D, a back etching process is performed on the lower surface 111b of the metal base plate 110 with the first solder layer 120 serving as an etch mask so as to partially remove the metal base plate 110 until the encapsulant 140 is exposed. At the time, a lead group 112 comprising a plurality of leads 112a isolated to one another and at least a die pad 112b carrying the chip 130 is defined. The die pad 112b is surrounded by the leads 112a and the leads 112a are arranged in at least a ring or an array, which the invention is not limited to.

Since both the first recess patterns 115a and the second recess pattern 115b have the depressions with two different depths, when the first solder layer 120 fills in the first recess patterns 115a and the second recess pattern 115b, a portion of the side surface 113b of each the lead 112a would be covered by the first solder layer 120 in advance. In more details, a lower surface 113a and a portion of at least a side surface 113b of each the lead 112a are exposed from the encapsulant 140, namely, the leads 112a protrude out of the bottom of the encapsulant 140 and partially covered by the first solder layer 120. Herein, each of the first recess patterns 115a defines the outline of the lower surface 113a and the portion of the side surface 113b of each of the leads 112a exposed from the encapsulant 140, while the second recess pattern 115b defines the outline of the lower surface 117a and a portion of the side surface 117b of the die pad 112b exposed from the encapsulant 140. It should be noted that each of the leads 112a has a plurality of side surfaces 113b when the leads 112a are in rectangular or polygonal shapes but only one side surface 113b when the leads 112a are in circular or oval shapes, where the shape of the leads 112a is not limited to in the present invention.

In the embodiment, the back etching process forms a first neck portion 113c on the side surface 113b of each the lead 112a and a second neck portion 117c on the side surface 117b of the die pad 112b. In particular, in the embodiment, since both the first recess patterns 115a and the second recess pattern 115b have the depressions with two different depths, positions of the first neck portions 113c and the second neck portion 117c formed after the back etching process would be closer to the encapsulant 140. Now, the non-leaded package structure 100a is substantially accomplished.

In short, the non-leaded package structure 100a of the embodiment comprises a lead group 112, a first solder layer 120, a chip 130, an encapsulant 140 and a metallic plating layer 150. The lead group 112 includes leads 112a and a die pad 112b, wherein the leads 112a are disposed surrounding the die pad 112b, the side surface 113b of each the lead 112a has a first neck portion 113c and the side surface 117b of the die pad 112b has a second neck portion 117c. The chip 130 is mounted on the die pad 112b of the lead group 112 and is electrically connected to the corresponding leads 112a through the bonding wires 170, respectively. The encapsulant 140 covers the chip 130, the bonding wires 170 and the lead group 112, wherein the bottom surface 117a and a portion of the side surface 117b of the die pad 112b and the lower surface 113a and a portion of the side surface 113b of each the lead 112a are exposed from the encapsulant 140. Namely, the leads 112a and the die pad 112b protrude out of the encapsulant 140. The first solder layer 120 covers the lower surface 113a and a portion of the side surface 113b of each the lead 112a exposed from the encapsulant 140 and the bottom surface 117a and a portion of the side surface 117b of the die pad 112b exposed from the encapsulant 140. The metallic plating layer 150 is formed on the upper surface opposite to the lower surface 113a of each the lead 112a (i.e., on the upper surface 111a of the metal base plate 110).

It should be noted that, in the embodiment, the back etching process can be selected from isotropic etching or anisotropic etching, which the invention is not limited to. The etchant adopted in the back etching process in the embodiment has a selective etching property of etching copper or the material of the metal base plate 110 but leaving tin (i.e., the solder layer 120) intact. Hence after the back etching process, the first solder layer 120 remains firmly on the lower surface 113a of each the lead 112a and the bottom surface 117a of the die pad 112b, which can effectively advance the process yield and the structure reliability. In addition, the first solder layer 120 also serves as a shield layer to protect the parts of each the lead 112a and the die pad 112b exposed from the encapsulant 140, including the lower/bottom surfaces 113a, 117a and portions of the side surfaces 113b, 117b.

Figure 1E:
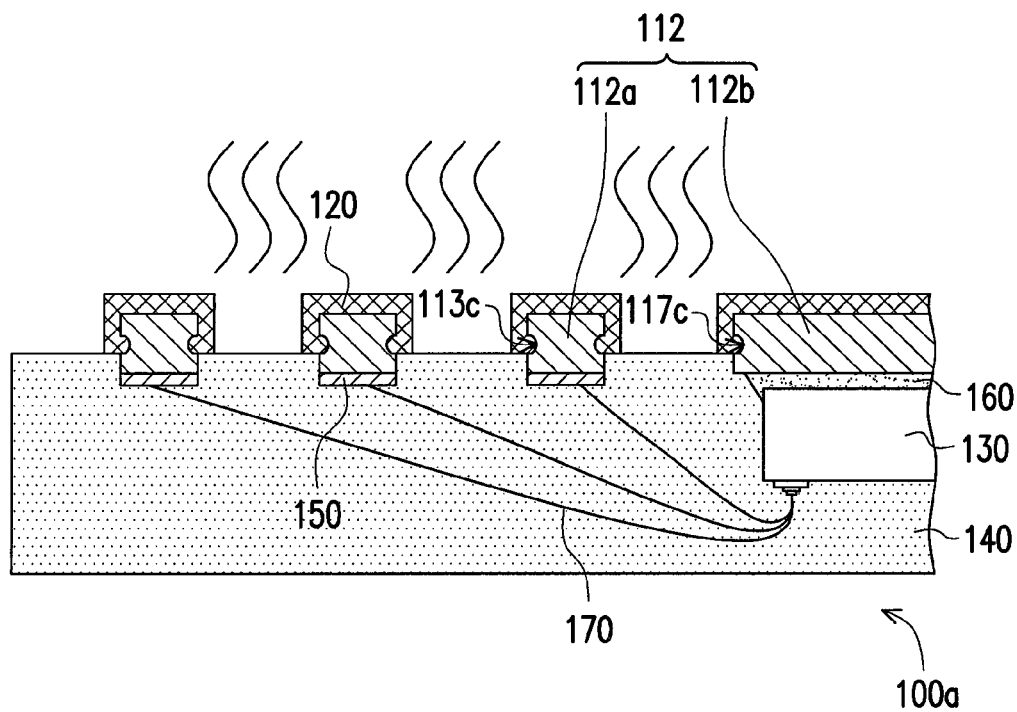

Referring to FIG. 1E, in the successive process, a solder reflow process is then performed to the first solder layers 120 of the non-leaded package structure 100a so as to attach the non-leaded package structure 100a to a PCB (not shown) by surface mount technology (SMT). In particular, during the solder reflow process, a portion of the first solder layer 120 would extend and fill into the second neck portion 117c of the die pad 112b and the first neck portion 113c of each the lead 112a, which can effectively increase the bonding strengths between the first solder layer 120 and the die pad 112b and the leads 112a.

In short, the preformed first solder layer 120 in the embodiment not only serves as a shield layer for the leads 112a and the die pad 112b but also simplifies the subsequent manufacturing processes by omitting an additional solder application procedure. In comparison with the prior art where a solder paste should further be applied on the exposed terminals of the non-leaded package structure after the package structure is completed for surface mount application, while in the embodiment, the solder reflow process can directly be applied to the preformed first solder layer 120 on the non-leaded package structure 100a to have the non-leaded package structure 100a being attached to the PCB by surface mount technology (SMT). Hence, the structure reliability can be effectively advanced and the convenience of the subsequent manufacturing processes can be enhanced by efficiently simplifying the procedure.

Several different embodiments are described in following to explain the non-leaded package structure and the manufacturing method thereof. It should be noted that in the following embodiments the same reference numerals are used to refer to the same or alike elements as in the above-described embodiment and detailed descriptions of some technologies illustrated above are omitted hereafter for simplification.

Figure 2A:
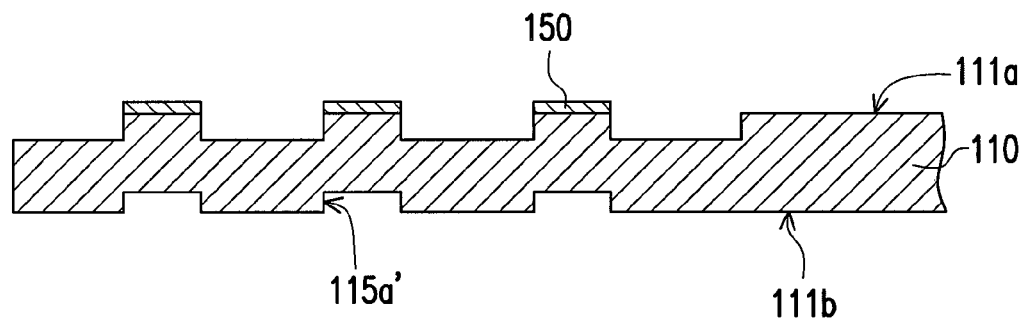
FIGS. 2A-2C are cross-sectional diagrams of a method for manufacturing a non-leaded package structure according to another embodiment of the invention.
Figure 2B:
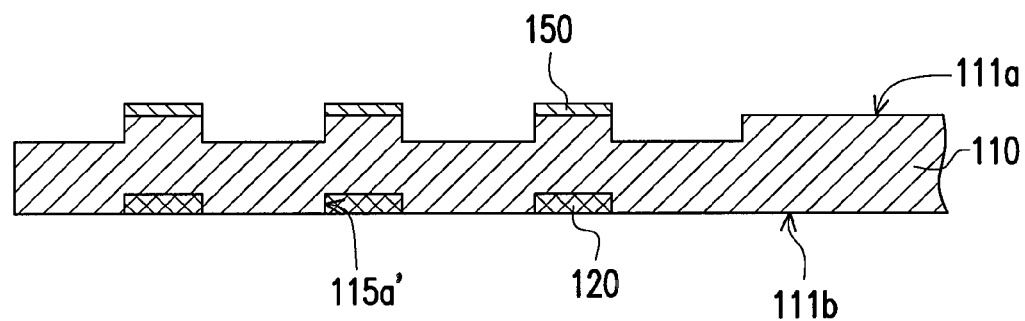
Figure 2C:
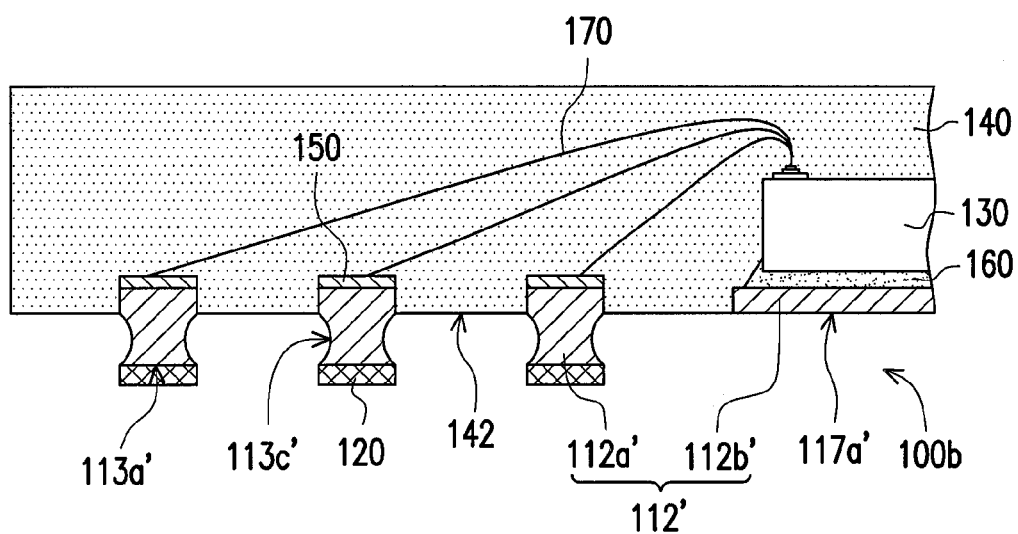

FIGS. 2A-2C are cross-sectional diagrams of a method for manufacturing a non-leaded package structure according to another embodiment of the invention. Referring to FIGS. 2A-2C, a non-leaded package structure 100b as shown in FIG. 2C is mainly similar to the non-leaded package structure 100a in FIG. 1D but different in the structure design of the lead group 112' and the disposition of the first solder layer 120.

In more details, in the embodiment, each the first recess pattern 115a' substantially has an equal depth relative to the lower surface 111b. That is to say, each the first recess pattern 115a' substantially has only one depth. Moreover, the bottom surface 117a' of the die pad 112b' of the lead group 112' is flush with a bottom surface 142 of the encapsulant 140. The first neck portion 113c' of the lead 112a' is substantially greater in extent than the first neck portion 113c of the lead 112a in FIG. 1D. In addition, the first solder layer 120 merely covers the lower surface 113a' of each the lead 112a'.

The manufacturing method of the non-leaded package structure 100b in the embodiment can mainly adopt the method used for manufacturing the non-leaded package structure 100a as shown in FIGS. 1A-1D. However, in the embodiment, only the first recess patterns 115a' are formed on the lower surface 111b of the metal base plate 110 corresponding to the first protruding parts 114a, and each of the first recess patterns 115a' substantially has an equal depth relative to the lower surface 111b. Then referring to FIG. 2B, a first solder layer 120 is formed in each of the first recess patterns 115a'. The chip 130 is then mounted on the second protruding part 114b of the metal base plate 110, bonding wires 170 are formed and electrically connect the chip 130 to the first protruding parts 114a respectively and an encapsulant 140 is formed, as shown in FIG. 1C. Further, a back etching process is performed on the lower surface 111b of the metal base plate 110 so as to define the lead group 112' which comprises the leads 112a' and the die pad 112b'. During the back etching process, due to the undercut phenomenon, the etching depth on the side surface of each the lead 112a' is relatively larger so that a larger neck portion is produced. That is to say, the first neck portion 113c' of each the lead 112a' in the embodiment is substantially greater in extent than the first neck portion 113c of each the lead 112a in FIG. 1D. Besides, there is no second recess pattern 115b formed corresponding to the second protruding part 114b in the embodiment; hence, after the back etching process, the die pad 112b' would be etched to a position flush with the bottom surface 142 of the encapsulant 140. However, in other embodiments, the die pad 112b' can protrude out of the encapsulant 140, similarly to the die pad 112b, which the invention is not limited to. Up to the point, the non-leaded package structure 100b of the embodiment is substantially accomplished.

Figure 3A:
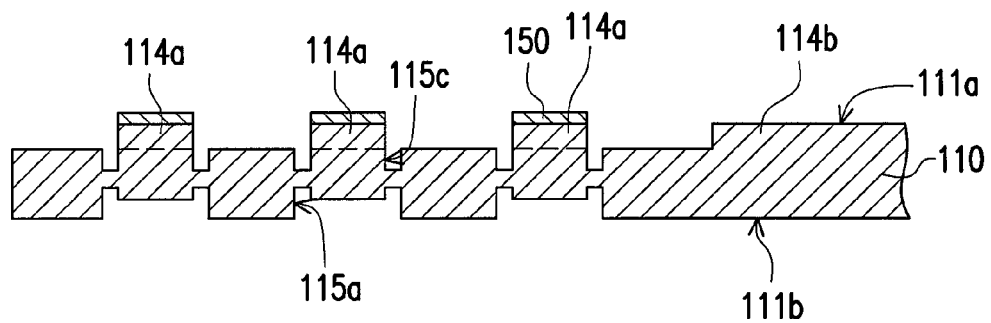
FIGS. 3A-3C are cross-sectional diagrams of a method for manufacturing a non-leaded package structure according to yet another embodiment of the invention.
Figure 3B:
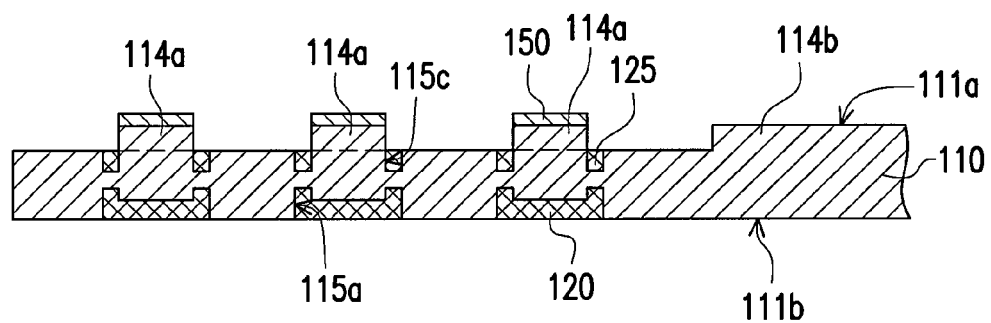
Figure 3C:
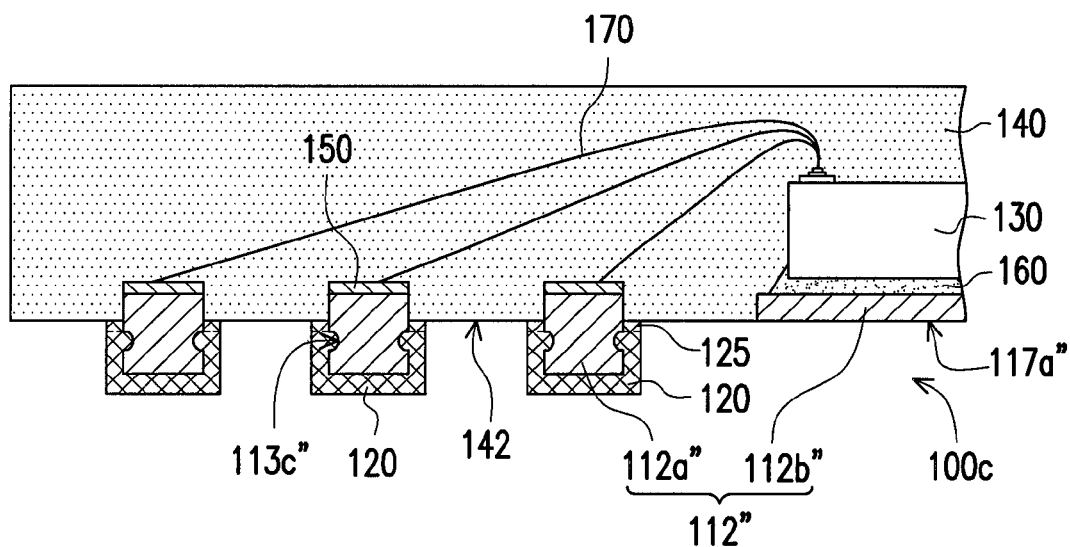

FIGS. 3A-3C are cross-sectional diagrams of a method for manufacturing a non-leaded package structure according to yet another embodiment of the invention. Referring to FIGS. 3A-3C, a non-leaded package structure 100c as shown in FIG. 3C is mainly similar to the non-leaded package structure 100a in FIG. 1D but different in the structure design of the lead group 112" and the disposition of the first solder layer 120.

In more details, in the embodiment, the bottom surface 117a" of the die pad 112b" of the metal base plate 110 is flush with the bottom surface 142 of the encapsulant 140. However, in other embodiments, the die pad 112b" can protrude out of the encapsulant 140, similarly to the die pad 112b, which the invention is not limited to. The solder layers including the first solder layer 120 and a second solder layer 125 entirely cover the parts of the leads 112a" exposed from the encapsulant 140 and fill into the first neck portions 113c"'.

The manufacturing method of the non-leaded package structure 100c in the embodiment can mainly adopt the method used for manufacturing the non-leaded package structure 100a as shown in FIGS. 1A-1E. In the embodiment, however, only the first recess patterns 115a are formed on the lower surface 111b of the metal base plate 110 corresponding to the first protruding parts 114a, and a plurality of third recess patterns 115c are further formed on the upper surface 111a of the metal base plate 110, wherein the third recess patterns 115c correspond to the first recess patterns 115a and surround the first protruding parts 114a respectively. When forming the first solder layer 120, a second solder layer 125 is also formed in each of the third recess patterns 115c. Then, the chip 130 is mounted on the second protruding part 114b of the metal base plate 110, bonding wires 170 are formed and electrically connect the chip 130 to the first protruding parts 114a respectively and an encapsulant 140 is formed, as shown in FIG. 1C. Next, a back etching process is performed on the lower surface 111b of the metal base plate 110 so as to define the lead group 112" which comprises the leads 112a" and the die pad 112b". Finally, a solder reflow process is performed to the first solder layer 120 and the second solder layer 125 for attaching the non-leaded package structure 100c to a PCB (not shown) by surface mount technology (SMT). In particular, during the solder reflow process, a portion of the first solder layer 120 or the second solder layer 125 would extend into the first neck portion 113c" of each the lead 112a", and the molten first solder layer 120 and second solder layer 125 would join together as a whole. Therefore, the non-leaded package structure 100c of the embodiment is substantially accomplished.

In summary, in the present invention the solder layer is preformed in the recess patterns on the lower surface of the metal base plate, so that it can serve as an etch mask during the back etching process and the leads protruding out of the encapsulant with the solder layer already coated on the lower surfaces thereof can be formed after the back etching process. In comparison with the prior art where a solder layer should further be applied on the exposed terminals of a non-leaded package structure after the package structure is completed for surface mount application, the preformed solder layer in the present invention functions as the shield layer of the leads and simplifies the subsequent manufacturing processes for surface mount application by omitting an additional solder application procedure. Therefore, the reliability can be effectively advanced and the convenience of the subsequent manufacturing processes can be enhanced by efficiently simplifying the procedure.

It will be apparent to those skilled in the art that the descriptions above are several preferred embodiments of the invention only, which does not limit the implementing range of the invention. Various modifications and variations can be made to the structure of the invention without departing from the scope or spirit of the invention.

What is claimed is:

1. A manufacturing method of a non-leaded package structure, comprising:
providing a metal base plate, having an upper surface and a lower surface opposite to each other;
patterning the upper surface and the lower surface of the metal base plate to form a plurality of first protruding parts and at least a second protruding part on the upper surface and a plurality of first recess patterns on the lower surface corresponding to the first protruding parts;
respectively forming a first solder layer in each of the first recess patterns;
mounting a chip on the second protruding part;
forming a plurality of bonding wires electrically connecting the chip to the first protruding parts respectively;
forming an encapsulant on the upper surface of the metal base plate, wherein the encapsulant covers the chip, the first protruding parts, the second protruding part and the bonding wires; and
perform a back etching process on the lower surface of the metal base plate with the first solder layer serving as an etch mask to partially remove the metal base plate until the encapsulant is exposed and a lead group is defined, wherein the lead group comprises at least a die pad carrying the chip and a plurality of leads isolated to one another, and a lower surface and a portion of at least a side surface of each of the leads are exposed from the encapsulant and partially covered by the first solder layer.

2. The manufacturing method of the non-leaded package structure as claimed in claim 1, wherein each of the first recess patterns defines outlines of the lower surface and the portion of the side surface of each the lead exposed from the encapsulant.

3. The manufacturing method of the non-leaded package structure as claimed in claim 1, wherein the method of forming the first recess patterns is selected from etching or laser ablation.

4. The manufacturing method of the non-leaded package structure as claimed in claim 1, further comprising:
   forming a metallic plating layer on the first protruding parts after patterning the metal base plate.

5. The manufacturing method of the non-leaded package structure as claimed in claim 1, further comprising:
   forming a first neck portion on the side surface of each the lead during the back etching process performed on the lower surface of the metal base plate.

6. The manufacturing method of the non-leaded package structure as claimed in claim 5, further comprising:
   performing a reflow process to the first solder layer after the back etching process performed on the lower surface of the metal base plate, wherein a portion of the first solder layer extends and fills into the first neck portion of each the lead.

7. The manufacturing method of the non-leaded package structure as claimed in claim 1, further comprising:
   forming a second recess pattern on the lower surface of the metal base plate corresponding to the second protruding part during patterning the metal base plate; and
   forming the first solder layer in the second recess pattern during forming the first solder layer in each of the first recess patterns.

8. The manufacturing method of the non-leaded package structure as claimed in claim 1, further comprising:
   forming a plurality of third recess patterns on the upper surface of the metal base plate during patterning the metal base plate, wherein each of the third recess patterns surrounds each the first protruding part and is corresponding to each of the first recess patterns; and
   forming a second solder layer in each of the third recess patterns during forming the first solder layer.

9. The manufacturing method of the non-leaded package structure as claimed in claim 1, wherein each the first recess pattern comprises a first depression and a second depression, the second depression surrounds the first depression, and the depth of the second depression relative to the lower surface of the metal base plate is greater than the depth of the first depression relative to the lower surface of the metal base plate.

10. The manufacturing method of the non-leaded package structure as claimed in claim 1, wherein the first recess pattern substantially has an equal depth relative to the lower surface of the metal base plate.

* * * * *